(12) United States Patent
Yamamoto (10) Patent No.: US 8,876,356 B2
(45) Date of Patent: Nov. 4, 2014

(54) ILLUMINATION DEVICE AND DISPLAY DEVICE

(75) Inventor: Koichi Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 275 days.

(21) Appl. No.: 13/421,110

(22) Filed: Mar. 15, 2012

(65) Prior Publication Data

US 2012/0243255 A1  Sep. 27, 2012

(30) Foreign Application Priority Data

Mar. 23, 2011  (JP) ................................. 2011-064583

(51) Int. Cl.
| | |
|---|---|
| F21V 23/06 | (2006.01) |
| G02F 1/1335 | (2006.01) |
| F21V 23/00 | (2006.01) |
| F21V 8/00 | (2006.01) |
| H05K 1/02 | (2006.01) |
| H05K 3/00 | (2006.01) |

(52) U.S. Cl.
CPC ........ *G02B 6/0083* (2013.01); *G02F 1/133615* (2013.01); *H05K 2201/09972* (2013.01); *H01L 2224/73265* (2013.01); *G02B 6/0073* (2013.01); *H05K 2201/10106* (2013.01); *G02B 6/009* (2013.01); *G02F 2001/133628* (2013.01); *H05K 1/0296* (2013.01); *H05K 3/0061* (2013.01); *H05K 1/0278* (2013.01); *H01L 2224/48091* (2013.01); *H05K 2201/2054* (2013.01); *H05K 1/028* (2013.01); *H01L 2224/49107* (2013.01); *G02B 6/0068* (2013.01)
USPC ............................. 362/631; 362/602; 362/630

(58) Field of Classification Search
CPC .. G02B 6/0081; G02B 6/0083; G02B 6/0086; G02F 1/133615; H05K 2201/05; H05K 2201/056

USPC .......................................... 362/602, 608–631
See application file for complete search history.

(56) References Cited

U.S. PATENT DOCUMENTS

| | | | |
|---|---|---|---|
| 8,100,573 B2 * | 1/2012 | Kim et al. .................... 362/612 |
| 2007/0096129 A1 * | 5/2007 | Park ................................ 257/98 |
| 2009/0052165 A1 * | 2/2009 | Hamada ....................... 362/97.3 |
| 2009/0116262 A1 * | 5/2009 | Park .............................. 362/612 |
| 2010/0246212 A1 | 9/2010 | Yang et al. |
| 2011/0164401 A1 * | 7/2011 | Choi et al. ................... 362/97.1 |

FOREIGN PATENT DOCUMENTS

JP  2010-231944  10/2010

OTHER PUBLICATIONS

U.S. Appl. No. 13/428,351, filed Mar. 23, 2012, Yamamoto, et al.

\* cited by examiner

*Primary Examiner* — Anh Mai
*Assistant Examiner* — Nathaniel Lee
(74) *Attorney, Agent, or Firm* — Oblon, Spivak, McClelland, Maier & Neustadt, L.L.P.

(57) ABSTRACT

An illumination device including: a support member accommodating therein a light guiding plate, and having a board placement space in a region where being along a longitudinal direction of an end surface of the light guiding plate, and extending from the end surface side of the light guiding plate to a back surface side thereof; and a light source circuit unit including a bendable circuit board including first and second regions, the first region including light emitting chips, and the second region being formed with a densely-packed portion of a wiring pattern of the light emitting chips. The light source circuit unit is placed in the board placement space after being bent to allow the light emitting chips to face the end surface of the light guiding plate, and to allow the densely-packed portion of the wiring pattern to come on the back surface side of the light guiding plate.

15 Claims, 6 Drawing Sheets

ILLUMINATION DEVICE AND DISPLAY DEVICE

BACKGROUND

The present technology relates to an illumination device in which a light source is a light emitting element exemplified by a light emitting diode (LED) mounted on a circuit board, and a display device provided with the illumination device as a backlight.

SUMMARY

A light emitting diode (LED) has been recently receiving attention for use as a backlight (light source) of a liquid crystal display device or others, or as a light source of an illumination device as an alternative to an incandescent lamp or a fluorescent lamp. The backlight is of two types, i.e., direct backlight and edge backlight. With a direct backlight, a light source is flatly disposed directly beneath an optical sheet such as diffusion sheet. With an edge backlight, a plurality of LED chips is disposed in series on a circuit board, and the circuit board is disposed in the vicinity of the edge surface of a light guiding plate. As for the edge backlight, the technology is advancing to make it thinner together with the size reduction of the LED chips and the thickness reduction of the light guiding plate (for example, see Japanese Unexamined Patent Application Publication No. 2010-231944).

With a display device using such an edge backlight, however, the circuit board itself has a difficulty in size reduction. This is because, for achieving partial driving to partially control the luminance of the backlight on an image basis, there is expected to arrange in parallel a large number of LED wiring patterns on a block basis for luminance control, and this arrangement causes the resulting wiring section to be wider in width. As such, the partially-driven backlight has the disadvantage of failing to achieve the thinner circuit board therein even if the LED chips are reduced in size and the light guiding plate is reduced in thickness.

It is thus desirable to provide an illumination device capable of partial driving by a substantially thin circuit board, and a display device provided with the illumination device.

An illumination device according to an embodiment of the present disclosure includes a support member, and a light source circuit unit. The support member accommodates therein a light guiding plate, and includes a board placement space along the end surface of the light guiding plate. The light source circuit unit includes a bendable circuit board provided with first and second regions with a bending line serving as a boundary therebetween. The first region includes a plurality of light emitting chips in rows, and the second region is formed with a densely-packed portion of a wiring pattern of the light emitting chips. The light source circuit unit is disposed in the board placement space such that the light emitting chips face the end surface of the light guiding plate.

A display device according to an embodiment of the present disclosure includes a display panel; and an illumination device as a light source with respect to the display panel. The illumination device includes a support member accommodating a light guiding plate, and having a board placement space in a region where being along a longitudinal direction of an end surface of the light guiding plate, and extending from the end surface side of the light guiding plate to a back surface side thereof; and a light source circuit unit including a bendable circuit board including first and second regions with a bending line serving as a boundary therebetween, the first region including a plurality of light emitting chips in rows, and the second region being formed with a densely-packed portion of a wiring pattern of the light emitting chips. The light source circuit unit is placed in the board placement space after being bent to allow the light emitting chips to face the end surface of the light guiding plate, and to allow the densely-packed portion of the wiring pattern to come on the back surface side of the light guiding plate.

With the illumination device or the display device according to the embodiment of the present disclosure, the circuit board configuring the light source circuit unit is made bendable between the first region where a plurality of light emitting chips are arranged in rows, and the second region where the densely-packed portion of the wiring pattern is formed. With such a configuration, the circuit board incorporated in the support member is reduced in width by the amount corresponding to the bending angle.

With the illumination device or the display device according to the embodiment of the present disclosure, the circuit board configuring the light source circuit unit is made bendable between two regions along a bending line therebetween. This substantially reduces the width of the circuit board corresponding to partial driving so that the resulting device is favorably much reduced in thickness in its entirety.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENT

In the below, an embodiment of the present disclosure is described in detail by referring to the accompanying drawings. Herein, the description is to be given in the following order.

1. Embodiment (an example in which the circuit board of an edge backlight is bent and accommodated in a back chassis.
2. Specific example of light source circuit unit
3. Modification 1 (an example in which a circuit board is additionally provided with a reflection layer)
4. Modification 2 (an example in which the circuit board of Modification 1 is additionally provided also with a reflection sheet)
5. Modification 3 (an example in which the circuit board of Modification 1 is additionally provided also with heat dissipation properties)

Embodiment

Figure 1:
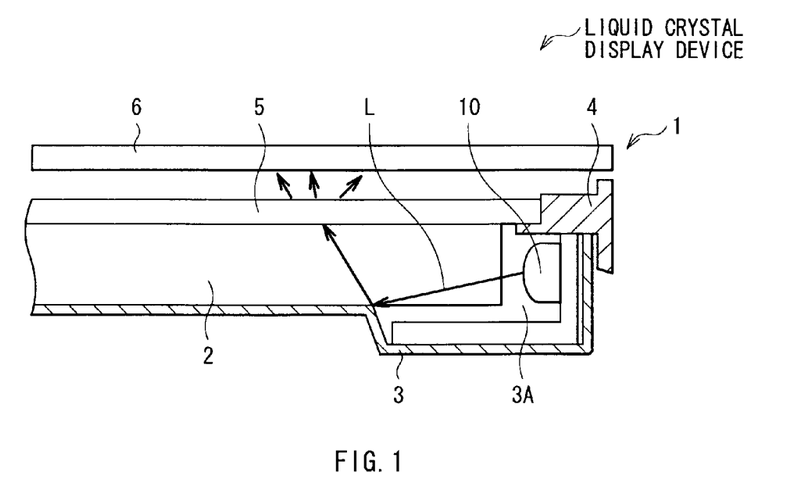
FIG. 1 is a diagram of a liquid crystal display device in an embodiment of the present disclosure, showing the cross-sectional configuration thereof.

FIG. 1 shows the configuration of a liquid crystal display device using an edge backlight 1 in an embodiment of the present disclosure. This backlight 1 includes a light source circuit unit 10, which is disposed in a board placement space 3A of a back chassis 3 (support member) so as to oppose the end surface of a light guiding plate 2. The board placement space 3A is disposed along the longitudinal direction of the end surface of the light guiding plate 2. In this example, the board placement space 3A has the cross-sectional shape like the letter L extending from the end surface side toward the back surface side.

Above the light source circuit unit 10, an optical sheet such as diffusion sheet 5 is supported by a middle chassis 4. Such a backlight 1 as above is provided, on the front surface, with a liquid crystal panel 6.

Figure 2:
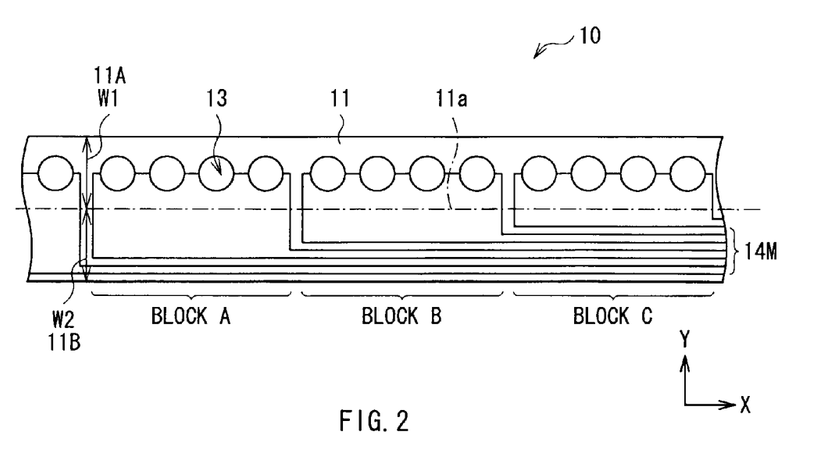
FIG. 2 is a diagram of a light source circuit unit extracted from the liquid crystal display device of FIG. 1, showing the configuration thereof in a planar view.

As shown in FIG. 2, the light source circuit unit 10 includes a circuit board 11 provided thereon with a plurality of LED chips 13 (light emitting chips). The circuit board 11 is made bendable along a bending line 11a at an angle of 90 degrees, for example. This bending line 11a is formed in the longitudinal direction of the circuit board 11, and serves as a boundary between two regions, i.e., a first region 11A (with the width of W1) above the line, and a second region 11B (with the width of W2) below the line. The LED chips 13 are arranged in rows in the first region 11A, and are divided into blocks A, B, C, and others. The LED chips 13 are available for partial driving on a block basis. In each of the blocks A, B, C, and others, two or more LED chips 13 are connected in series. The blocks A, B, C, and others each have a drive power source (not shown), and a wiring pattern (power supply line), i.e., a part of a wiring pattern 14 that will be described later, is formed between the drive power sources. The wiring pattern is extracted from each of the blocks in the width direction of the circuit board 11, i.e., Y-axis direction of FIG. 2. The extracted portions of the wiring pattern are then all oriented to be along the longitudinal direction (X-axis direction) to be parallel to one another, and form a densely-packed section, i.e., a wiring densely-packed section 14M. This wiring densely-packed section 14M is provided to the second region 11B of the circuit board 11.

The light source circuit unit 10 in this embodiment is incorporated into the back chassis 3 after the circuit board 11 is bent along the bending line 11a at an angle of 90 degrees, for example. Specifically, the light source circuit unit 10 is accommodated in the board placement space 3A such that the LED chips 13 (the first region 11A) of the circuit board 11 face the end surface of the light guiding plate 2, and that the wiring densely-packed section 14M (the second region 11B) comes on the back surface side of the light guiding plate 2.

Note that exemplified herein is the case that a plurality of LED chips 13 are arranged in rows, and FIG. 2 shows an exemplary linear arrangement thereof. This is surely not restrictive, and the LED chips 13 may be arranged in series in each of the blocks and in parallel between the blocks, i.e., not every LED chip is expected to be on the same line.

In the liquid crystal display device configured as such, light L extracted from each of the LED chips 13 of the light source circuit unit 10 comes from the end surface of the light guiding plate 2, and is emitted from the front surface of the light guiding plate 2. The emitted light then reaches the liquid crystal panel 6 after going through the diffusion sheet 5, thereby making display.

With the liquid crystal display device as such, the circuit board 11 configuring the light source circuit unit 10 is made bendable between the first region 11A including a plurality of LED chips 13 arranged in rows, and the second region 11B formed with a part of the wiring pattern, i.e., the densely-packed section 14M. As such, the circuit board 11 remains bent when it is incorporated into the back chassis 3. With the circuit board 11 bent as such, the substantial width W thereof is reduced by the bending angle. To be specific, assuming that the angle of bending is 90 degrees, the substantial width W of the circuit board 11 becomes equal to the width W1 of the first region 11A, and this means the width reduction by the width W2 that was taken up by the second region 11B. As such, in the embodiment, the circuit board 11 is possibly reduced in width corresponding to partial driving so that the resulting device is to be much thinner in its entirety than those already in the market.

In the below, by referring to FIGS. 3 to 9, described is an exemplary configuration of the light source circuit unit 10 being bendable as described above. In the light source circuit unit 10 of FIG. 3, a plurality of (two in this example) LED chips 13 on the circuit board 11 are each covered by a dome-shaped sealing lens 12.

Figure 3:
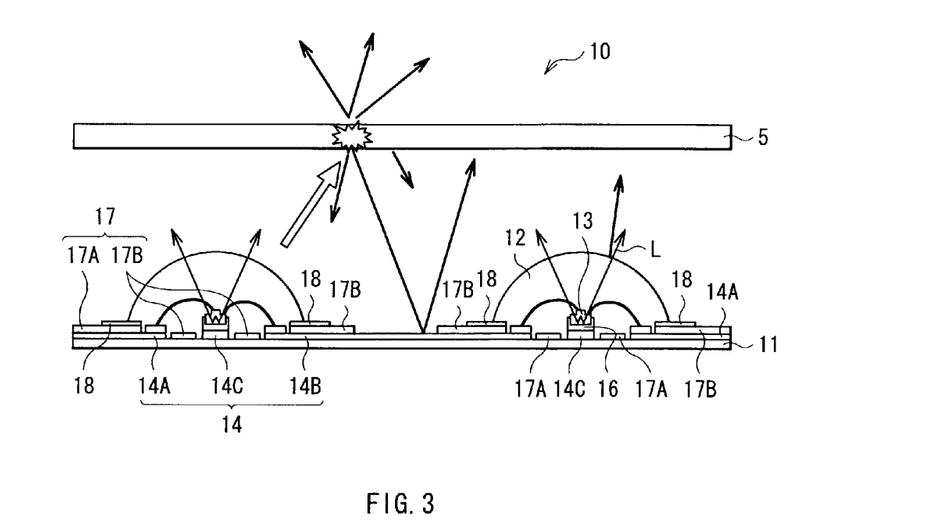
FIG. 3 is a cross-sectional view of the light source circuit unit, showing the detailed configuration of a main part thereof.

The circuit board 11 is provided, on the surface, with the wiring pattern 14 having the light reflecting properties. This wiring pattern 14 includes a wiring layer 14A (first wiring layer), a wiring layer 14B (second wiring layer), and a chip mounting layer 14C. The wiring layers 14A and 14B are for a supply of drive current to the corresponding LED chip 13, and the chip mounting layer 14 is for mounting use of the LED chip 13. These wiring layers 14A and 14B, and the chip mounting layer 14C are all formed in the same process using a material being conductive and light reflective, and are electrically separated from one another. Note that, in this embodiment, the chip mounting layer 14C serves only as a base for the LED chip 13, and does not serve as wiring. Herein, the expression of "being light reflective" means that the material has a reflectivity of 90% or higher with respect to the light coming from the LED chip 13, i.e., back-surface emitting light. The material being light reflective as such is specifically exemplified by aluminum (Al), silver (Ag), or an alloy thereof. Considering the cost, Al is most preferable.

Herein, in order to simplify the process as above, the wiring layers 14A, 14B, and 14C are preferably formed by the same process using the same material. However, as long as having the light reflecting properties, the chip mounting layer 14C may be formed by a process different from that for the wiring layers 14A and 14B using a material different from that therefor.

Figure 4:
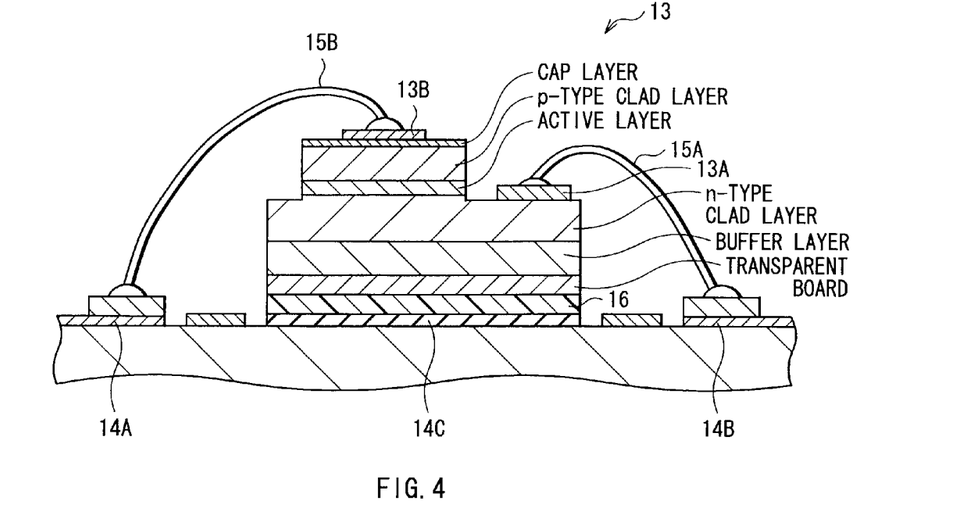
FIG. 4 is a diagram showing the electrode configuration of an LED chip.

As shown in FIG. 4, for example, the LED chip 13 is provided, on the surface, with two electrodes (an n-type electrode 13A, and a p-type electrode 13B). Such an LED chip 13 is configured by a buffer layer, an n-type clad layer, an active layer, a p-type clad layer, and a cap layer, which are formed on a transparent substrate, for example. The n-type electrode 13A is electrically connected to the n-type clad layer, and the p-type electrode 13B is electrically connected to the cap layer.

In the LED chip 13, the n-type electrode 13A and the p-type electrode 13B are connected electrically to the wiring layers 14A and 14B via wiring pieces (bonding wires) 15A and 15B, respectively. The wiring pieces 15A and 15B are each made of aluminum (Al), gold (Au), or others. In other words, the LED chip 13 is driven by a current flowing through the wiring layers 14A and 14B, and the wiring pieces 15A and 15B, thereby emitting light.

In this embodiment, such an LED chip 13 is directly mounted on the chip mounting layer 14C. Herein, the expression of "directly" means to fixedly adhere the back surface of the LED chip 13 itself (the transparent substrate described above) to the chip mounting layer 14C by die bonding or others with no need to package the LED chip 13, or to provide a reflection layer, e.g., gold or tin plated layer, between the chip mounting layer 14C and the LED chip 13. Herein, as shown in FIG. 3, an adhesive layer such as transparent paste 16 for die bonding use may exist between the chip mounting layer 14C and the LED chip 13. Note that, in the embodiment, the transparent paste 16 is not conductive, but as will be described later, when the LED chip in use includes electrodes on both surfaces, the transparent paste 16 may be conductive considering that the chip mounting layer 14C serves as a current path.

The circuit board 11 is preferably flexible and bendable, and specifically, is possibly a resin film printed thereon with the wiring pattern 14. The resin includes PET (polyethylene terephthalate), fluorine, PEN (polyethylene naphthalate), and others. The resin film has the thickness of 20 µm to 50 µm, and the wiring pattern 14 has the thickness of 35 µm to 50 µm, for example, but these values are surely not restrictive.

The circuit board 11 may also be a metal base substrate, e.g., Al base substrate, formed on the surface with an insulating resin layer made of polyimide or epoxy resin, for example. The insulating resin layer may be formed thereon with the wiring pattern made of the material being light reflective as above. The circuit board 11 may also be a film base printed with the wiring pattern made of the material being light reflective as above. The film base is the one made of glass-containing resin such as FR4 (glass epoxy resin) or CEM3 (glass composite resin).

In the area between the wiring layers 14A and 14B and the outer periphery portion of the sealing lens 12, a resist layer 17A white in color and a water-repellent layer 18a formed to enclose the LED chip 13 are provided in this order. Another resist layer 17B also white in color is provided on the circuit board 11 between the chip mounting layer 14C and the wiring layers 14A and 14B in the region covered by the sealing lens 12. The resist white in color includes an inorganic material exemplified by titanium oxide ($TiO_2$) particles and barium sulfate ($BaSO_4$) particles, and an organic material exemplified by porous acrylic resin particles having an infinite number of pores for light dispersion, and polycarbonate resin particles. As a possible specific material for use, Solder Resist FINEDEL DSR-330 S42-13W (product name; manufactured by TAMURA KAKEN CORPORATION) will do. The white resist layers 17 (17A and 17B) as such may be reduced in reflectivity as described above, but have the light reflecting properties (80% or little higher). In this embodiment, these resist layers 17 (17A and 17B) are to each function as a reflection layer (auxiliary reflection layer) in the region around the LED chip 13. In FIG. 1, the resist layers 17A and 17B look separated from each other, but are supposed to be solidly formed entirely over the circuit board 11 except the region where the LED chip 13 is mounted, and the region of connecting the LED chip 13 and the wiring layers 14A and 14B. The water-repellent layer 18 is for forming into a predetermined shape the sealing lens 12 covering the LED chip 13. The water-repellent layer 18 is formed by a water-repellent material such as fluorocarbon resin, and this water-repellent layer 18 takes the shape, e.g., toroidal shape, of the bottom surface of the sealing lens 12.

The sealing lens 12 is for protecting the LED chip 13, and for improving the efficiency of extracting the light L coming from the LED chip 13. This sealing lens 12 is made of a transparent resin such as silicon or acrylic resin, for example, and is so configured as to cover entirely over the LED chip 13.

The sealing lens 12 may contain a fluorescent material. For example, if a fluorescent material is mulled into a transparent resin such as silicon or acrylic resin with the weight ratio of 10%, the light coming from the LED chip 13 becomes adjustable in tone of color. Specifically, when light of a predetermined wavelength comes from the LED chip 13, the fluorescent material in the sealing lens 12 is pumped so that the light to be emitted is of a wavelength different from that of the incoming light. The fluorescent material for use is exemplified by an yttrium/aluminum/garnet (YAG) fluorescent substance.

With this light source circuit unit 10, the light emitted from the LED chip 13 is extracted toward the front via the sealing lens 12, but is partially directed to the circuit board 11 side from the back surface side of the LED chip 13 (back-surface emitting light). This back-surface emitting light is reflected on the surface of the chip mounting layer 14C being highly light reflective with the LED chip 13 mounted thereon, and then is extracted toward the front as indicated by an arrow L in FIG. 3. Moreover, when a diffusion sheet (not shown) is disposed above, the reflected light is partially reflected by the diffusion sheet, and then returns to the circuit board 11 side. However, the light is again put back to the diffusion sheet side by the white resist layers 17 (17A and 17B) also having the light reflecting properties.

This light source circuit unit 10 uses, as a reflection layer, a partial region (the chip mounting layer 14C) of the wiring pattern 14 made of Al or others having a high reflectivity, and on the reflection layer, the LED chips 13 are directly die-bonded. It means any normal LED chips become available for use with no more need for expensive silver plating, and no more need also for forming a reflection layer in advance on each back surface of the chips. What is more, any general (inexpensive) transparent paste becomes available for bonding use. This accordingly simplifies the configuration and the manufacturing process, and the cost is favorably reduced.

Such a light source circuit unit 10 possibly takes the following configurations, i.e., Modifications 1 to 3.

(Modification 1)

Figure 5A:
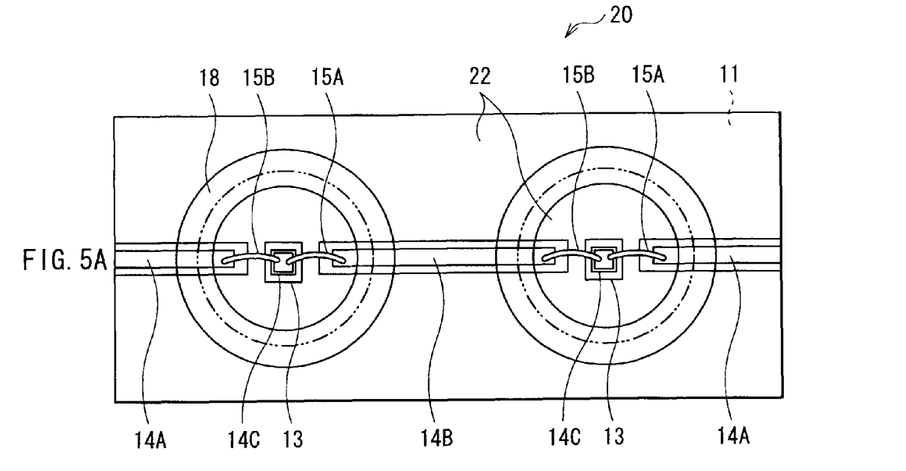
FIGS. 5A and 5B are respectively plan and cross-sectional views of a light source circuit unit in Modification 1.
Figure 5B:
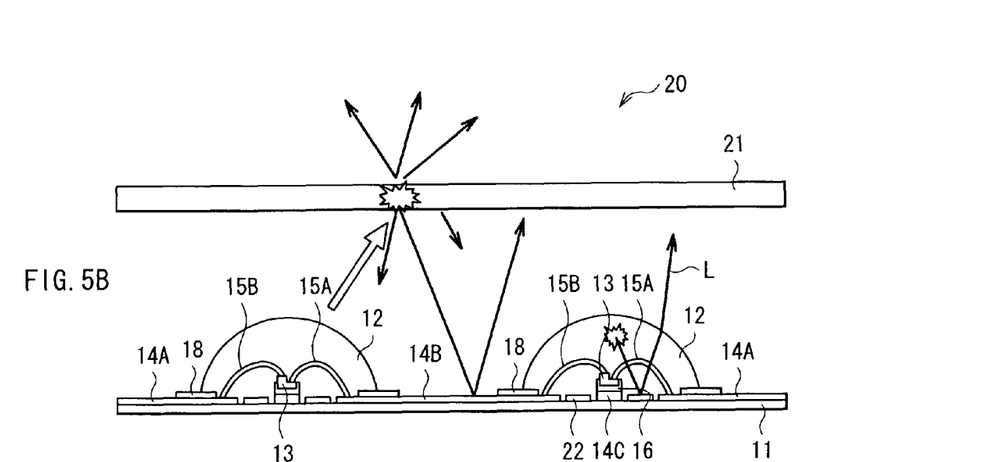

A light source circuit unit 20 of FIGS. 5A and 5B is provided, on the circuit board 11, with a plurality of (two in this example) LED chips 13 each covered by the sealing lens 12 similarly to the above. On the circuit board 11, any portion where the wiring pattern 14 (the wiring layers 14A and 14B, and the chip mounting layer 14C) is not formed is provided in its entirety with a reflection layer 22. The reflection layer 22 is formed at the same time when the wiring pattern 14 is printed using the same light-reflecting material, e.g., Al. Above the light source circuit 20, a diffusion sheet 21 is provided.

In such a light source circuit unit 20, similarly to the embodiment described above, the back-surface emitting light coming from the back surface side of the LED chips 13 toward the circuit board 11 side is reflected on the surface of the chip mounting layer 14C having the light reflecting properties, and then is extracted toward the front as indicated by the arrow in the drawing. Also in the light source circuit unit 20, the light extracted toward the front is diffused by the diffusion sheet 21, but is partially reflected and then is put back to the circuit board 11 side. The light put back by the diffusion sheet 21 as such is effectively reflected again to the diffusion sheet 21 side by the reflection layer 22 formed in the region where the wiring pattern 14 is not formed. When the sealing lens 12 contains any fluorescent material, similarly, the light emitted in the sealing lens 12 and directed toward the circuit board 11 side is reflected to the diffusion sheet 21 side by the reflection layer 22.

The white resist used in the light source circuit unit 10 above may become yellowish and be reduced in reflectivity if it is heated in the post-processing of die bonding, wire bonding, and soldering. On the other hand, in the light source circuit unit 20, such a white resist is not used but the reflection layer 22 is alternatively formed at the same time when the wiring pattern 14 is printed. This accordingly prevents any possible reduction of reflectivity, and achieves the reduction of cost.

(Modification 2)

Figure 6A:
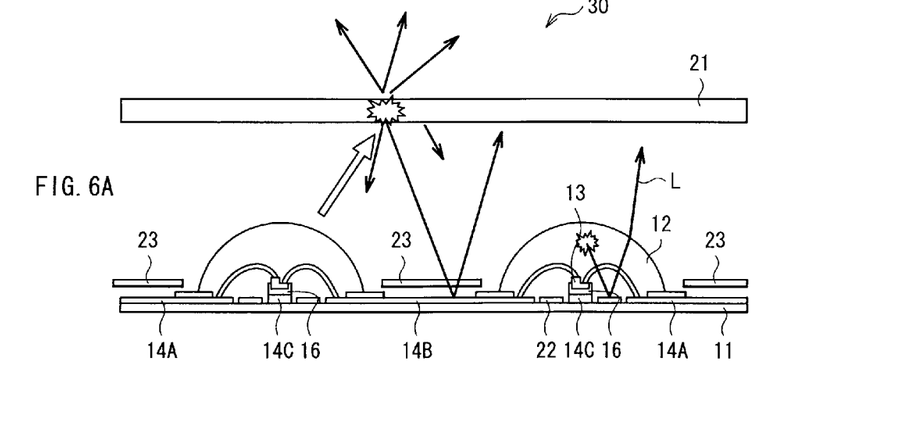
FIGS. 6A and 6B are respectively a cross-sectional view of a light source circuit unit in Modification 2, and a plan view of a reflection sheet.
Figure 6B:
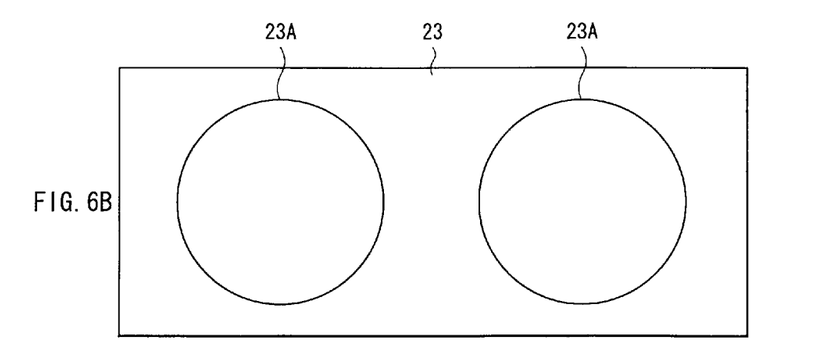

A light source circuit unit 30 of FIG. 6A is the one additionally provided with a reflection sheet 23 above the reflection layer 22 located between the LED chips 13 and 13 of the light source circuit unit 20 of Modification 1 with the aim of improving the luminance. FIG. 6B shows the configuration of the reflection sheet 23 in a planar view, and at the position corresponding to the sealing lens 12, an aperture 23A is formed. The reflection sheet 23 may be made of the same material as that configuring the wiring pattern 14, e.g., Al, or alternatively, may be made of a material with a higher reflectivity, e.g., white PET material.

(Modification 3)

Figure 7:
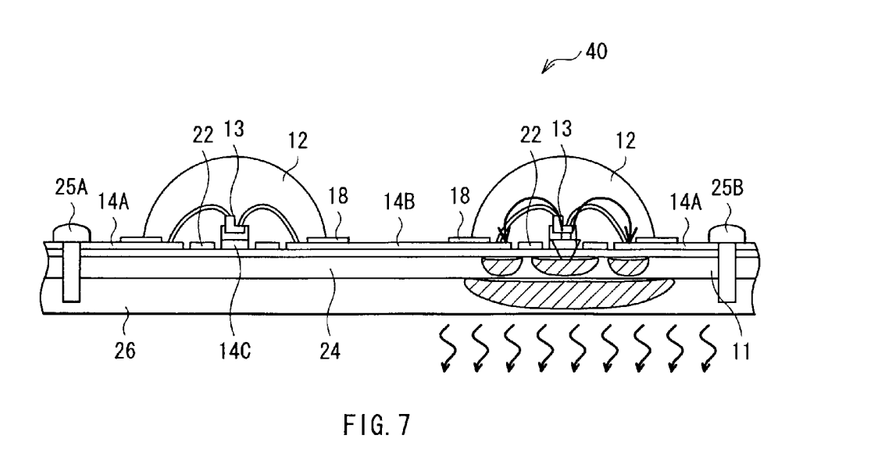
FIG. 7 is a cross-sectional view of a light source circuit unit in Modification 3.
Figure 8:
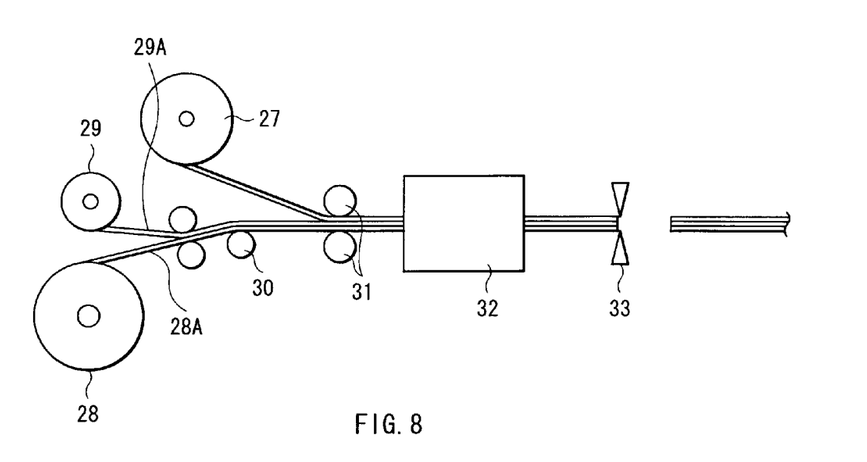
FIG. 8 is a diagram for illustrating a method of manufacturing a circuit board in the light source circuit unit in Modification 3.

A light source circuit unit 40 of FIG. 7 is the one provided with a heat-dissipating metal sheet 24 laminated to the back surface of the circuit board 11 of the light source circuit unit 20 described above. This metal sheet 24 is fixed to a back chassis 26 together with the circuit board 11 using screws 25A and 25B. To be specific, the metal sheet 24 is a thin plate made of Al or Cu (copper) with the thickness of 50 μm to 150 μm, for example. Such a thickness of the metal sheet 24 allows the circuit board 11 to be bent together with the metal sheet 24. This metal sheet 24 is possibly formed in one piece with the circuit board 11 on the back surface thereof by Roll to Roll processing shown in FIG. 8, for example. Specifically, after film and sheet feeding from rolls via an intermediate roll 30, i.e., a resin film 27A from a resin film roll 27, an Al sheet 28A from an Al sheet roll 28, and an adhesive sheet 29A from an adhesive roll 29, the Al sheet 28A is laminated entirely over the back surface of the resin film 27A by a compression-bonding roll 31. Thereafter, in a wiring pattern printer 32, the resin film 27A is printed, on the surface, with a wiring pattern made of Al, for example. The resulting resin film 27A printed with the wiring pattern as such is cut by a cutter 33 into desired-sized pieces, thereby manufacturing the circuit board 11 provided with the metal sheet 24 on the back surface thereof. Note that such a method is surely not restrictive, and any other methods will also do as long as the metal sheet 24 of the circuit board 11 is formed with no wrinkle before die bonding of the LED chips 13. The adhesive for use is epoxy resin, for example. Herein, with the aim of producing the better effect of heat dissipation, the adhesive may contain highly heat-conductive particles such as alumina particles to improve the heat conductivity.

With the metal sheet 24 formed on the back surface with no wrinkle as such, the resulting circuit board 11 becomes flexible but at the same time having a fixed level of rigidity. The circuit board 11 thus becomes available for die bonding and wire bonding using a general method for board fixing by adsorption.

Figure 9:
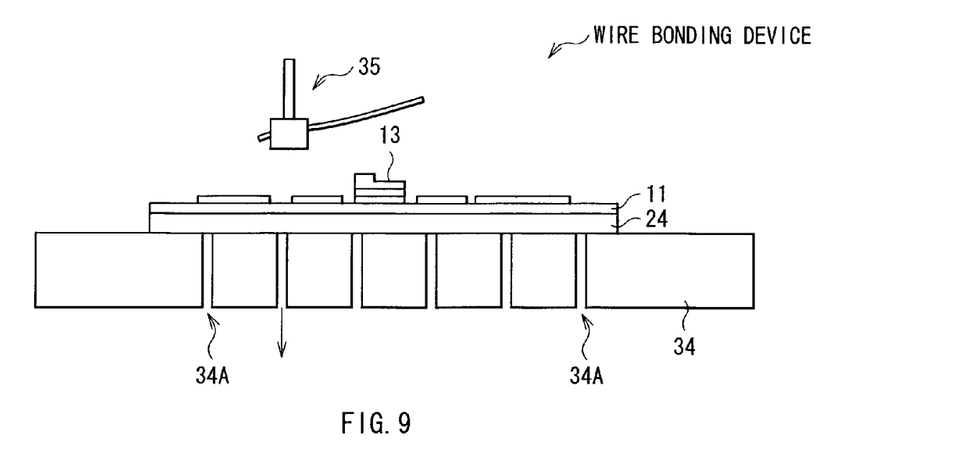
FIG. 9 is a diagram for illustrating a manufacturing process for the light source circuit unit in Modification 3.

FIG. 9 is a diagram showing a board fixing method using a device for wire bonding. This wire bonding device is for fixing the circuit board 11 onto a base 34, which has a plurality of absorption ports 34A. Specifically, the circuit board 11 is placed on the base 34 for vacuum adsorption via the absorption ports 34A so that the circuit board 11 is fixed onto the base 34. The resulting structure is then subjected to wire bonding by a head 35. At this time, since the circuit board 11 in Modification 3 is appropriately rigid because of the metal sheet 24, the circuit board 11 is resistant to wrinkles. Accordingly, the board fixing becomes possible by automation using a general bonding device with no need to increase the number of the absorption ports 34A.

Further, in the embodiment, the heat from the LED chips 13 is transferred to the metal sheet 24 (thin plate made of Al) in its entirety, and via such a metal sheet 24, the heat is then transferred to the back chassis 26 with a good efficiency. In other words, the metal sheet 24 produces the effect of heat dissipation effectively. Still further, when the metal sheet 24 is made of the same material and has the same thickness as the reflection layer 22 on the surface side of the circuit board 11, e.g., made of Al, the circuit board 11 has almost the same thermal expansion coefficient on the front and back surfaces, thereby favorably protecting the circuit board 11 from any possible warping.

The light source circuit units 10, 20, 30, and 40 described above are each bendable, and are each applicable to illumination devices of various uses and applications, e.g., as streetlight or illumination for surgery. The light source circuit units 10, 20, 30, and 40 are also each suitable for use as an edge backlight (illumination device) for a display device such as liquid crystal display device.

While the present technology has been described in detail by referring to the embodiment and the modifications, the present technology is not restrictive to the embodiment and others described above, and it is understood that numerous other modifications may be possibly devised. For example, described in the embodiment above or others is the specific exemplary configuration of the light source circuit unit 10. This is surely not restrictive, and any other configurations will also do as long as the light source circuit unit 10 is bendable along a bending line in the longitudinal direction to have two regions different in orientation.

Figure 10:
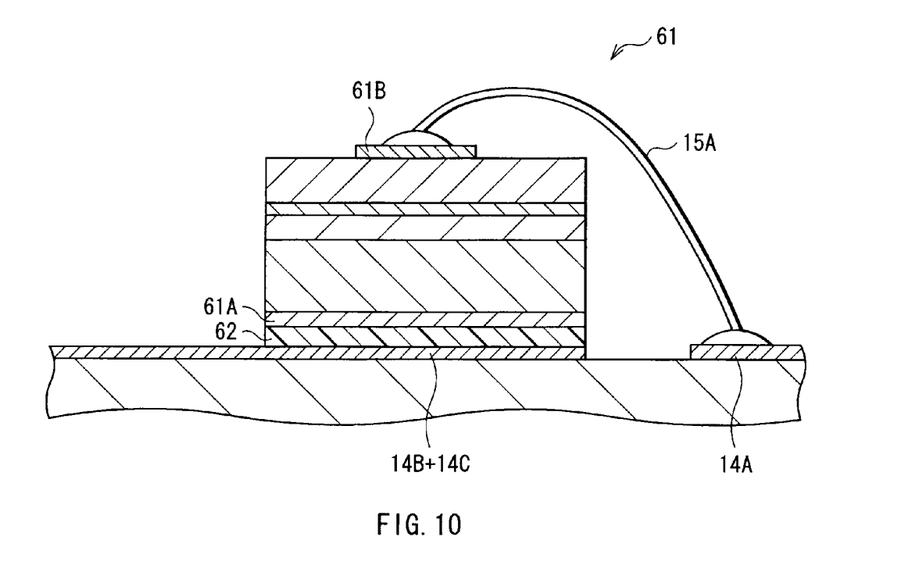
FIG. 10 is a diagram showing the wiring configuration of another LED chip.

Moreover, described in the above is the LED chips 13 each provided with two electrodes on one surface for use as LED chips in the light source circuit unit 10. Alternatively, as shown in FIG. 10, another possibility includes an LED chip 61 of a type including n- and p-type electrodes 61A and 61B on both surfaces to face each other. If this is the configuration, the chip mounting layer 14C may be formed to be in one piece with the other wiring layer 14B, and a transparent paste 62 for use may be conductive. In other words, one of the electrodes of the LED chip 61, i.e., the p-type electrode 61B, is provided with a drive current via the wiring layer 14A and the wiring piece 15A, and the remaining of the electrodes of the LED chip 61, i.e., the n-type electrode 61A, is provided with a drive current via the wiring layer 14B and the chip mounting layer 14C.

The present technology may be configured as follows.

(1) An illumination device including:

a support member accommodating therein a light guiding plate, and having a board placement space in a region where being along a longitudinal direction of an end surface of the light guiding plate, and extending from the end surface side of the light guiding plate to a back surface side thereof; and a light source circuit unit including a bendable circuit board including first and second regions with a bending line serving as a boundary therebetween, the first region including a plurality of light emitting chips in rows, and the second region being formed with a densely-packed portion of a wiring pattern of the light emitting chips, in which the light source circuit unit is placed in the board placement space after being bent to allow the light emitting chips to face the end surface of the light guiding plate, and to allow the densely-packed portion of the wiring pattern to come on the back surface side of the light guiding plate.

(2) The illumination device according to (1) above, in which the light guiding plate is provided, on a front surface, with an optical sheet.

(3) The illumination device according to (1) or (2) above, in which the light emitting chips are divided into two or more blocks for partial driving, and the wiring pattern partially extracted from each of the blocks are arranged in parallel in the second region.

(4) The illumination device according to any one of (1) to (3) above, in which the circuit board of the light source circuit unit includes a light-reflective wiring pattern on a surface, includes a chip mounting layer in a part of the wiring pattern, is provided with the light emitting chips directly mounted on the chip mounting layer, and is driven by a current flowing through the wiring pattern.

(5) The light source circuit unit according to (4) above, including a sealing lens, on the circuit board, covering each of the light emitting chips and a region therearound.

(6) The illumination device according to (4) or (5) above, in which the light emitting chips are light emitting diodes.

(7) The illumination device according to any one of (4) to (6) above, in which the light emitting chips are each provided with a pair of electrodes on a surface, and the wiring pattern includes the chip mounting layer, and first and second wiring layers to which the two electrodes of each of the light emitting chips are respectively electrically connected.

(8) The illumination device according to any one of (4) to (7) above, in which the light emitting chips are each provided with a pair of electrodes on both surfaces, and the wiring pattern includes a wiring layer serving also as the chip mounting layer to which one of the electrodes of each of the light emitting chips is electrically connected, and another wiring layer to which the remaining electrode is electrically connected.

(9) The illumination device according to any one of (4) to (8) above, in which the circuit board is a resin film printed with the wiring pattern, a reflective metal substrate formed on the surface with an insulating film printed with the wiring pattern, or a glass-containing resin film printed thereon with the wiring pattern.

(10) The illumination device according to any one of (4) to (9) above, in which the circuit board is laminated, on the back surface side, with a heat-dissipating metal sheet.

(11) A display device, including:

a display panel; and an illumination device as a light source with respect to the display panel, in which the illumination device includes a support member accommodating a light guiding plate, and having a board placement space in a region where being along a longitudinal direction of an end surface of the light guiding plate, and extending from the end surface side of the light guiding plate to a back surface side thereof; and a light source circuit unit including a bendable circuit board including first and second regions with a bending line serving as a boundary therebetween, the first region including a plurality of light emitting chips in rows, and the second region being formed with a densely-packed portion of a wiring pattern of the light emitting chips, and the light source circuit unit is placed in the board placement space after being bent to allow the light emitting chips to face the end surface of the light guiding plate, and to allow the densely-packed portion of the wiring pattern to come on the back surface side of the light guiding plate.

The present disclosure contains subject matter related to that disclosed in Japanese Priority Patent Application JP 2011-64583 filed in the Japan Patent Office on Mar. 23, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An illumination device, comprising:

a support member accommodating therein a light guiding plate, and having a board placement space in a region where being along a longitudinal direction of an end surface of the light guiding plate, and extending from the end surface side of the light guiding plate to a back surface side thereof; and a light source circuit unit including a bendable circuit board including first and second regions with a bending line serving as a boundary therebetween, the first region including a plurality of light emitting chips in rows, and the second region being formed with a densely-packed portion of a wiring pattern of the light emitting chips, wherein the light source circuit unit is placed in the board placement space after being bent to allow the light emitting chips to face the end surface of the light guiding plate, and to allow the densely-packed portion of the wiring pattern to come on the back surface side of the light guiding plate, and wherein the light emitting chips are divided into two or more blocks for partial driving, and the wiring pattern partially extracted from each of the blocks are arranged in parallel on a surface of the bendable circuit board in the second region and are offset to run alongside each other on the surface of the bendable circuit board in the second region.

2. The illumination device according to claim 1, wherein the light guiding plate is provided, on a front surface, with an optical sheet.

3. The illumination device according to claim 1, wherein the circuit board of the light source circuit unit includes a light-reflective wiring pattern on a surface, includes a chip mounting layer in a part of the wiring pattern, is provided with the light emitting chips directly mounted on the chip mounting layer, and is driven by a current flowing through the wiring pattern.

4. The light source circuit unit according to claim 3, comprising:

a sealing lens, on the circuit board, covering each of the light emitting chips and a region therearound.

5. The illumination device according to claim 3, wherein the light emitting chips are light emitting diodes.

6. The illumination device according to claim 3, wherein the light emitting chips are each provided with a pair of electrodes on a surface, and the wiring pattern includes the chip mounting layer, and first and second wiring layers to which the pair of electrodes of each of the light emitting chips are respectively electrically connected.

7. The illumination device according to claim 3,
wherein the light emitting chips are each provided with a pair of electrodes, a first electrode of the pair of electrodes being provided on a bottom surface of the light emitting chips and a second electrode of the pair of electrodes being provided on a top surface of the light emitting chips, and
wherein the wiring pattern includes a wiring layer serving also as the chip mounting layer to which the first electrode of each of the light emitting chips is electrically connected, and another wiring layer to which the second electrode is electrically connected.

8. The illumination device according to claim 7, wherein the first electrode of each of the light emitting chips is directly electrically connected to the chip mounting layer via a conductive transparent paste.

9. The illumination device according to claim 7, wherein the first electrode of each of the light emitting chips is a N-type electrode.

10. The illumination device according to claim 7, wherein the second electrode of each of the light emitting chips is a P-type electrode.

11. The illumination device according to claim 3, wherein the circuit board is a reflective metal substrate formed on the surface with an insulating film printed with the wiring pattern.

12. The illumination device according to claim 3, wherein the circuit board is laminated, on the back surface side, with a heat-dissipating metal sheet.

13. The illumination device according to claim 3, wherein the circuit board is a resin film printed with the wiring pattern.

14. The illumination device according to claim 3, wherein the circuit board is a glass-containing resin film printed thereon with the wiring pattern.

15. A display device, comprising:
a display panel; and
an illumination device as a light source with respect to the display panel, wherein
the illumination device includes
a support member accommodating a light guiding plate, and having a board placement space in a region where being along a longitudinal direction of an end surface of the light guiding plate, and extending from the end surface side of the light guiding plate to a back surface side thereof; and
a light source circuit unit including a bendable circuit board including first and second regions with a bending line serving as a boundary therebetween, the first region including a plurality of light emitting chips in rows, and the second region being formed with a densely-packed portion of a wiring pattern of the light emitting chips,
wherein the light source circuit unit is placed in the board placement space after being bent to allow the light emitting chips to face the end surface of the light guiding plate, and to allow the densely-packed portion of the wiring pattern to come on the back surface side of the light guiding plate, and
wherein the light emitting chips are divided into two or more blocks for partial driving, and the wiring pattern partially extracted from each of the blocks are arranged in parallel on a surface of the bendable circuit board in the second region and offset to run alongside each other on the surface of the bendable circuit board in the second region.

* * * * *